US005191280A

United States Patent [19]

Levy

[11] Patent Number: 5,191,280

[45] Date of Patent: Mar. 2, 1993

[54] ELECTRICAL CONTACT TEST PROBE

[75] Inventor: Sidney Levy, Belle Mead, N.J.

[73] Assignee: Thomas & Betts Corporation, Bridgewater, N.J.

[21] Appl. No.: 735,596

[22] Filed: Jul. 25, 1991

[51] Int. Cl.[5] .......... H01R 4/30; G01R 1/06

[52] U.S. Cl. .......... 324/72.5; 439/755; 439/219

[58] Field of Search .......... 439/217, 218, 219, 220, 439/221, 755; 324/149, 72.5

[56] References Cited

U.S. PATENT DOCUMENTS

| | | | |
|---|---|---|---|
| 2,918,646 | 12/1959 | Davidson | 324/72.5 |
| 3,267,452 | 8/1966 | Wolf . | |
| 3,745,516 | 7/1973 | Lieberman | 439/755 |
| 4,178,058 | 12/1979 | Swenson . | |
| 4,345,807 | 8/1982 | Shekel et al. | 439/755 |
| 4,377,317 | 3/1983 | Shekel et al. | 439/755 |
| 4,420,212 | 12/1983 | Wright . | |
| 4,565,414 | 1/1986 | French | 439/755 |
| 4,620,767 | 11/1986 | Woolf | 439/755 |
| 4,923,415 | 5/1990 | Lee | 439/755 |
| 4,975,089 | 12/1990 | Lee | 439/755 |
| 5,026,307 | 6/1991 | Lee | 439/755 |

*Primary Examiner*—Jack B. Harvey
*Assistant Examiner*—Maura K. Regan
*Attorney, Agent, or Firm*—Robert M. Rodrick; Salvatore J. Abbruzzese

[57] ABSTRACT

A test probe device is attachable to alligator clips of test equipment for establishing electrical engagement between an electrical contact supported within an insulative housing, which is accessible through an opening therein and the test equipment. The alligator clip includes a pair of actuatable jaws defining a connection region therebetween. The test probe device includes an elongate probe member insertable into the housing through the opening for electrical engagement with the contact. An attachment member is electrically coupled to the probe member. The attachment member is attachable to the alligator clip at a location remote from the connection region thereof, permitting the alligator clip to be used without removing the test probe device.

13 Claims, 2 Drawing Sheets

ELECTRICAL CONTACT TEST PROBE

FIELD OF INVENTION

The present invention relates generally to a probe used to make test connection to an electrical contact. More particularly the present invention relates to a test probe attachable to a testing apparatus and which is insertable into an electrical connector, so as to make test connection with a contact supported therein.

BACKGROUND OF THE INVENTION

In the telephone industry, electrical connectors are used to electrically connect the main run of the telephone wire, which may be either run underground or overhead, to individual wires leading to a subscriber's premises. Quite often it becomes necessary to test the integrity of the electrical connection without disturbing the interconnection between the individual wires and the main run of telephone wires. A telephone company installer typically employs test equipment which is attachable to the individual contacts of the electrical connection to conduct such tests.

With the advent of sealed electrical connections, that is, connectors employing contacts which are supported within an insulative housing, it has become necessary to develop accessory devices which permit access to the electrical contacts supported within the connector for test purposes. Thus, the telephone installer must have available these accessory components which must be properly inserted and removed each time testing is required. Further, in areas where a variety of telephone connectors are used, the installer must have available an accessory test component for each different type of connector.

The test equipment used by the installer includes wires which are typically terminated by metallic alligator clips which have actuatable jaws so that the clips may be "clipped" onto the accessory test component for test purposes. Without the accessory test component, which provides exterior access to the contact held internally of the connector housing, the alligator clips are useless for test purposes. Thus, when a telephone installer has misplaced a particular accessory test component necessary for the particular connector, testing cannot be achieved until the proper accessory test component is obtained. Further, any attempt to reform the alligator clips so that they can be inserted directly into the electrical connector would result in the clips be dedicated to testing only one type of electrical connection. Thus, an installer would have to carry plural different test equipment units so as to be able to test the different electrical connections. Also, test probes are known which are incorporated directly into the alligator clips at the time of manufacture. Such devices are shown, for example, in U.S. Pat. No. 4,345,807. While these types of devices, having built-in test probes, are useful for such test purposes, it would require the user to discard existing test equipment and obtain new equipment having these features.

It is desirable to provide a test probe which may be attached to existing telephone test equipment, and which would be available to the telephone installer without need to carry additional components.

SUMMARY OF THE INVENTION

It is an object of the present invention to provide a test probe which will permit test connection to an electrical contact supported in an insulative housing.

It is a further object of the present invention to provide a test probe which is attachable to existing test equipment permitting use of the test apparatus on a contact supported in insulative housing.

It is a still further object of the present invention to provide a test probe attachable to an alligator clip of telephone test equipment, the alligator clip having operable jaws where the test probe does not interfere with the operation of the jaws of the alligator clip.

In the efficient attainment of these and other objects, the present invention provides a test probe device for establishing electrical engagement between an electrical contact supported within an insulative housing and an alligator clip having a pair of actuatable jaws, defining a connection region therebetween. The test probe device includes a probe member insertable into the housing for electrical engagement with the contact. An attachment member which is electrically coupled to the probe member includes means for electrically and mechanically securing the attachment member to the alligator clip at a location remote from the connection region thereof.

As more fully described by way of a preferred embodiment herein, the invention includes a test probe device having an elongate probe extent having a first end for engagement with electrical contact supported in the housing, and an opposed second end. The test probe further includes an elongate attachment extent having a first end and opposed second end and attachment means for attaching the probe to a test device. Pivotal fastening means couples the second end of the attachment extent to the second end of the probe extent at a pivot point permitting relative rotational movement of the attachment extent and the probe extent about the pivot point. The attachment means permits securement of the probe to an alligator clip of a test device while permitting the independent operation of the jaws of the alligator clip.

DETAILED DESCRIPTION OF THE PREFERRED EMBODIMENT

Figure 1:
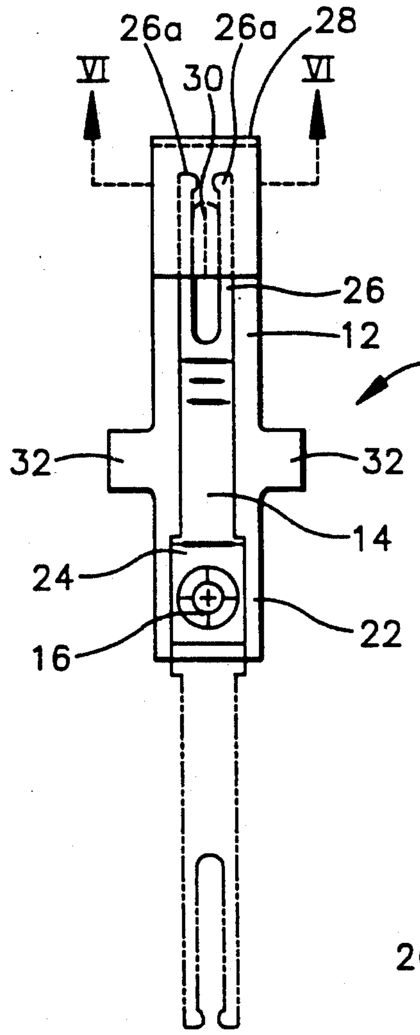
FIGS. 1 and 2 show, in top and side plan views respectively, the test probe device of the present invention.
Figure 2:
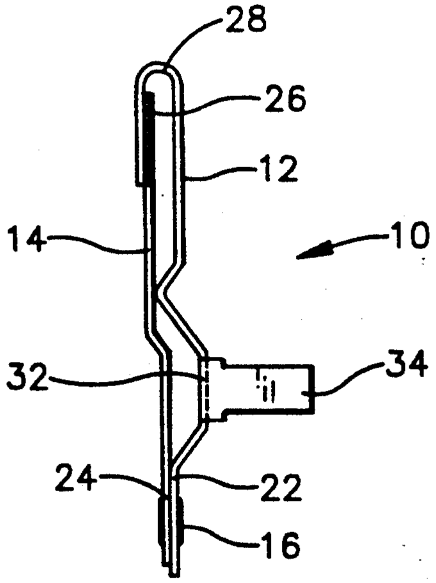

Referring to FIGS. 1 and 2, test probe 10 of the present invention is shown. Test probe 10 includes an attachment extent 12 and a probe extent 14 which are coupled for pivotal movement by rivet 16. As shown in FIGS. 1 and 2, probe extent 14 is rotationally movable with respect to attachment extent 12 between a closed position and an open position which is shown in phantom lines.

Figure 3:
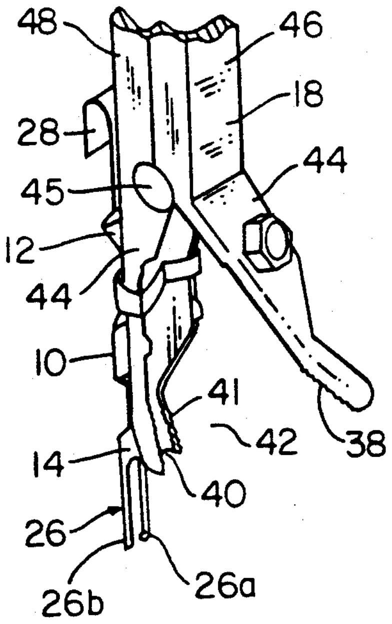
FIG. 3 is a perspective showing of the test probe device of the present invention secured to an alligator clip of test equipment.
Figure 4:
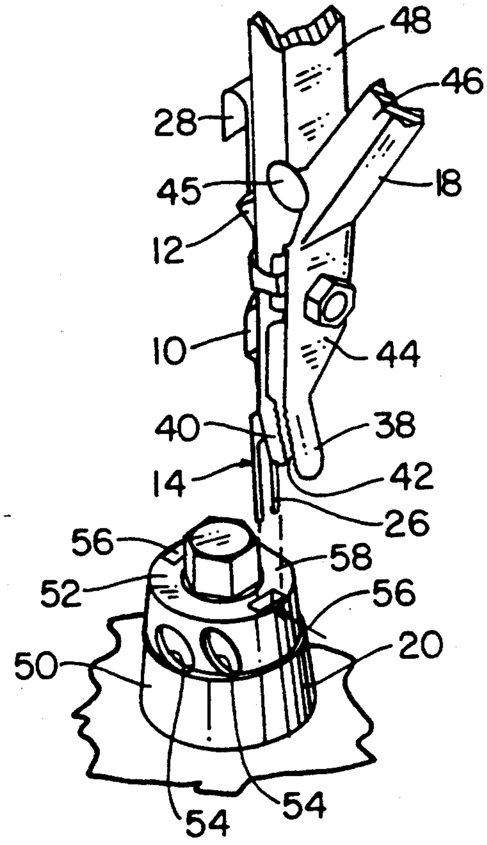
FIG. 4 shows the test probe device and alligator clip of FIG. 2 in position for connection with an electrical connector.
Figure 5:
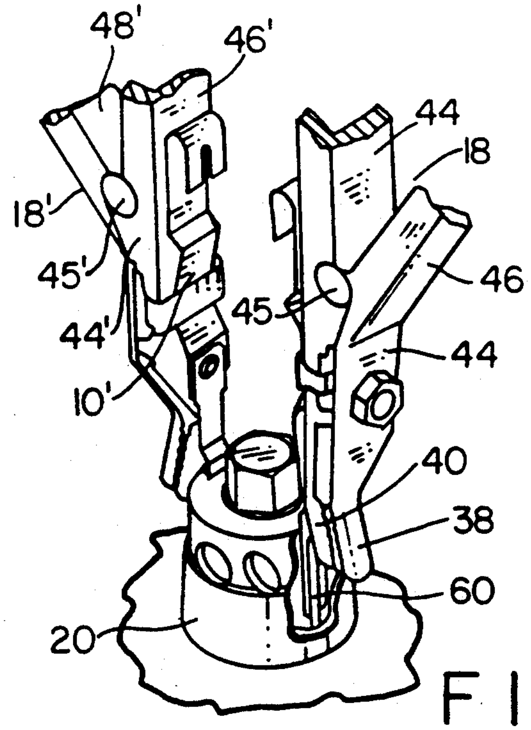
FIG. 5 shows a pair of test probe devices of the present invention attached to a pair of alligator clips in test connection position with an electrical connector.

As will be described in further detail hereinbelow and as shown in FIGS. 3 through 5, test probe 10 may be attached to an alligator clip 18 of a test apparatus (not shown). Test probe 10 permits electrical test connection to be made to an electrical connector 20.

Referring again to FIGS. 1 and 2, test probe 10 is described in further detail. Test probe 10 is formed from a suitably conductive metallic material, for example a copper alloy. Each one of attachment extent 12 and probe extent 14 is an elongate member having a respective end thereof 22 and 24 coupled by rivet 16 so as to permit relative rotational movement thereat. Probe extent 14 includes a terminal end 26 opposite end 24 which, as will be described in further detail hereinbelow, is used for establishing test connection with electrical connector 20.

Figure 6:
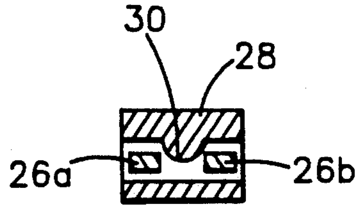
FIG. 6 is a sectional showing of the test probe device of FIG. 1 taken through the lines VI—VI thereof.

In the present illustrative embodiment, terminal end 26 is formed to have a pair of spaced apart tines 26*a* and 26*b*. Attachment extent 12 includes a reversely bent end portion 28 opposite end 22. Reversely bent end portion 28 includes an inwardly projecting detent 30 which permits the support of terminal end 26 of probe extent 14 in the closed position. As shown in FIG. 6, tines 26*a* and 26*b* are supported on either side of detent 30 so that terminal end 26 is releasably secured in its closed position by reversely bent end portion 28.

Attachment extent 12 further includes a pair of oppositely extending transverse tabs 32 which extend from a central location of attachment extent 12. Tabs 32 include depending tab extents 34, which as will be described in further detail hereinbelow, permit the attachment of test probe 10 to alligator clip 18.

Referring to FIGS. 3 through 5, alligator clip 18 is shown. Alligator clip 18 forms part of test equipment (not shown) which telephone installers carry to effect testing of telephone connections. The alligator clips 18 are conductive members typically attached by leads (not shown) to the test equipment. Various types of test equipment and associated alligator clips are presently being used by installers. The present invention permits use with these existing devices. Alligator clip 18 includes a pair of actuatable jaws 38 and 40, which define therebetween a connection region 42. Jaws 38 and 40 have serrated teeth 41 on opposed surfaces thereof, so that the alligator clip 18 may tightly engage a device to which connection is desired. A main body portion 44 extends from jaws 38 and 40, and are coupled together by fastener 45 which permits movement of jaws 38 and 40. A pair of manually actuatable handles 46 and 48 permit the opening and closing of jaws 38 and 40. Fastening member 45 may include a spring so that jaws 38 and 40 are actuatable under the bias of the spring.

As particularly shown in FIG. 3, test probe 10 is secured to alligator clip 18 so that the test probe 10 may be used in conjunction therewith to effect electrical test connection to electrical connector 20 shown in FIGS. 4 and 5. Test probe 10 is placed against the outside of body 44 of alligator clip 18. The reversely bent portion 28 of attachment extent 12 faces away from alligator clip 18. Tab extents 34 of attachment extent 12 extend around body 44 of clip 18. The tab extents 34 may be bent inwardly and against body 44 to mechanically and electrically secure test probe 10 to alligator clip 18. A tool such as pliers may be used to firmly crimp tab extents 34 around body 44 of alligator clip 18. It can be seen that the tab extents 34 permit the attachment extent 12 to be easily mounted to clip 18. The tab extents 34 are universal in nature, in that they permit mounting to a wide variety of alligator clip types. In all respects, the securement of test probe 10 to alligator clip 18 is at a location which is remote from connection region 42 between jaws 38 and 40. Thus, with test probe 10 mounted to alligator clip 18, the jaws 38 and 40 may be fully operable without need to remove test probe 10. Securement of test probe 10 is also out of interference of the actuation of jaws 38 and 40.

Referring to FIGS. 4 and 5, alligator clip 18 with test probe 10 mounted thereto may be used to make test connection to electrical connector 20. Connector 20 is a commercially available electrical connector used in the telephone industry to terminate drop wires leading to a subscriber's premises. Connector 20 is of the type shown and described in U.S. Pat. No. 4,993,966 issued Feb. 19, 1991. Connector 20 includes a housing comprised of a base 50 and cap 52 which support therebetween electrical contacts (not shown) which permit insulation displacing connection to drop wires inserted through apertures 54 in cap 52. Cap 52 also includes openings 56 on the upper surface 58 thereof. Openings 56 form test ports which permit test access to contact arm 60 shown in FIG. 5. Contact arm 60 is an integral part of the insulation displacing contact supported within electrical connector 20.

In order to employ test probe 10 and alligator clip 18 to make test connection to electrical connector 20, probe extent 14 is rotated from its closed position shown in FIGS. 1 and 2 to an open position shown in FIG. 3. The terminal end 26 of test probe 10 is then inserted through aperture 56 of cap 52 so that the tines 26*a* and 26*b* electrically engage contact arm 60 as shown in FIG. 5. A second alligator clip 18′ with a second test probe 10′ secured thereto is inserted in the other aperture 56 of cap 52 so as to make test engagement with the insulation displacing contact terminating the other wire of the drop wire pair. Typically, these wires represent the tip and ring contacts in a telephone connector. Suitable testing by the telephone installer may now be accomplished. Once testing is completed, each test probe is removed from apertures 56 and probe extent 14 may be pivoted upwardly so that the terminal end 26 resides within reversely bent end portion 28 of attachment extent 12. As mentioned above, terminal end 26 is captively secured in reversely bent portion 28 by detent 30 (FIG. 6).

Alligator clip 18 may now be used to make other test connections, even test connections not requiring the use of test probe 10 since test probe 10 is secured to alligator clip 18 at a location remote from jaws 38 and 40 thereof. Thus, the installer may now test other connections without having to remove test probe 10. As the test probe 10 is permanently mounted to alligator clip 18, when the need arises again for use of test probe 10, there is no need for the installer to carry an extra component.

Various changes to the foregoing described and shown structures would now be evident to those skilled in the art without departing from the contemplated scope of the invention. Accordingly, the true scope of the invention is set forth in the following claims.

I claim:

1. An attachable test probe device for establishing electrical engagement between an electrical contact supported within an insulative housing, accessible through an opening therein and an existing alligator clip having a pair of actuatable jaws defining a connection region therebetween, said test probe device comprising:

an elongate probe member insertable into said housing through said opening for electrical engagement with said contact; and an attachment member electrically coupled to said probe member, said attachment member including means for electrically and mechanically securing said attachment member to said alligator clip at a location remote from said connection region thereof;

wherein said attachment member includes an elongate attachment extent and wherein said securing means includes a pair of traverse deformable tabs extending from said elongate extent of said attachment member, said tabs being crimpably deformable to secure said attachment member to said alligator clip.

2. A test probe device of claim 1 wherein said probe member includes a first end for insertion into said housing opening and a second end coupled to said attachment extent.

3. A test probe device of claim 2 wherein said probe member second end is pivotally coupled to said attachment extent for relative movement between an open position where said first end of said probe member is positionable for insertion into said housing opening and a closed position wherein said first end of said probe member is removably secured to said attachment extent.

4. A test probe device of claim 3 wherein said elongate attachment extent includes a first end pivotally coupled to said second end of said probe member and a second end including means for supporting said first end of said probe member in said closed position.

5. A test probe device of claim 3 wherein said supporting means includes said second end of said attachment extent including a reversely bent portion defining a support location for supporting said first end of said probe member in said closed position.

6. A test probe device of claim 5 wherein said first end of said probe member includes a pair of spaced apart tines for engaging said electrical contact.

7. A test probe device of claim 6 wherein said support location of said attachment extent includes a raised detent for captively supporting said first end of said probe member between said times thereof.

8. A test probe attachable to existing alligator clips of telephone test equipment, said probe comprising:

an elongate probe extent having a first end for engagement with an electrical contact which is to be tested, and a second end opposite said first end;

an elongate attachment extent having a first end, an opposed second end and attachment means for attaching said test probe to said alligator clips;

pivotable fastening means coupling said second end of said attachment extent to said second end of said probe extent at a pivot point, said pivotable fastening means permitting relative rotational movement of said attachment extent and said probe extent about said pivot point.

9. A test probe of claim 8 wherein said first end of said probe extent includes a pair of spaced tines for engaging said electrical contact therebetween.

10. A test probe of claim 9 wherein said pivotal fastening means includes a metallic rivet.

11. A test clip of claim 10 wherein said attachment extent second end includes means for supporting said first end of said probe extent.

12. A test clip of claim 11 wherein said supporting means includes said attachment extent second end having a reversely bent portion for retaining said first end of said probe extent thereat.

13. A test clip of claim 12 wherein said supporting means further includes said second end of said attachment extent including a detent for supporting said spaced tines of said probe extent.

* * * * *